United States Patent
Wang et al.

(10) Patent No.: US 10,431,440 B2
(45) Date of Patent: Oct. 1, 2019

(54) METHODS AND APPARATUS FOR PROCESSING A SUBSTRATE

(71) Applicant: APPLIED MATERIALS, INC., Santa Clara, CA (US)

(72) Inventors: Rongjun Wang, Dublin, CA (US); Anantha K. Subramani, San Jose, CA (US); Chi Hong Ching, Santa Clara, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 178 days.

(21) Appl. No.: 14/975,793

(22) Filed: Dec. 20, 2015

(65) Prior Publication Data

US 2017/0178877 A1   Jun. 22, 2017

(51) Int. Cl.
*H01J 37/34*     (2006.01)
*C23C 14/34*    (2006.01)
(Continued)

(52) U.S. Cl.
CPC ........ *H01J 37/3441* (2013.01); *C23C 14/082* (2013.01); *C23C 14/3407* (2013.01);
(Continued)

(58) Field of Classification Search
CPC ............. H01J 37/3441; H01J 37/32477; H01J 37/3249; C23C 14/3407; C23C 14/3464
See application file for complete search history.

(56) References Cited

U.S. PATENT DOCUMENTS 3,864,239 A * 2/1975 Fletcher .............. C23C 14/3464
                                              204/192.12
4,952,295 A * 8/1990 Kawabata ............... C23C 14/06
                                              204/192.15
(Continued)

FOREIGN PATENT DOCUMENTS

JP    H05-179438 A    7/1993
JP    2001-107228 A   4/2001
JP    2011-168828 A   9/2011

OTHER PUBLICATIONS

International Search Report and Written Opinion dated Mar. 20, 2017 for PCT Application No. PCT/US2016/066080.
European Search Report for EP16879880 dated Jun. 12, 2019.

*Primary Examiner* — John J Brayton
(74) *Attorney, Agent, or Firm* — Moser Taboada; Alan Taboada

(57) ABSTRACT

Methods and apparatus for processing a substrate are disclosed herein. In some embodiments, a process chamber includes: a chamber body defining an interior volume; a substrate support to support a substrate within the interior volume; a plurality of cathodes coupled to the chamber body and having a corresponding plurality of targets to be sputtered onto the substrate; and a shield rotatably coupled to an upper portion of the chamber body and having at least one hole to expose at least one of the plurality of targets to be sputtered and at least one pocket disposed in a backside of the shield to accommodate and cover at least another one of the plurality of targets not to be sputtered, wherein the shield is configured to rotate about and linearly move along a central axis of the process chamber.

18 Claims, 4 Drawing Sheets

(51) Int. Cl.
 *H01J 37/32* (2006.01)
 *C23C 14/08* (2006.01)
 *H01L 21/02* (2006.01)

(52) U.S. Cl.
 CPC .... *C23C 14/3464* (2013.01); *H01J 37/32477* (2013.01); *H01J 37/3429* (2013.01); *H01J 37/3447* (2013.01); *H01L 21/02175* (2013.01); *H01L 21/02266* (2013.01)

(56) References Cited

U.S. PATENT DOCUMENTS

| | | | |
|---|---|---|---|
| 5,167,789 A * | 12/1992 | Latz | H01J 37/3408 204/192.12 |
| 6,051,113 A * | 4/2000 | Moslehi | C23C 14/568 118/719 |
| 7,815,782 B2 | 10/2010 | Inagawa et al. | |
| 8,173,248 B2 | 5/2012 | Hovsepian et al. | |
| 8,679,301 B2 * | 3/2014 | Park | C23C 14/081 204/192.15 |
| 9,017,535 B2 | 4/2015 | Nagamine et al. | |
| 2004/0231980 A1 | 11/2004 | Takahashi | |
| 2007/0080059 A1 | 4/2007 | Takahashi | |
| 2009/0068450 A1 | 3/2009 | Muenz et al. | |
| 2011/0147199 A1 | 6/2011 | Ohishi et al. | |
| 2011/0209986 A1 | 9/2011 | Kitada et al. | |
| 2012/0164354 A1 * | 6/2012 | Otani | C23C 14/185 427/580 |
| 2013/0048494 A1 | 2/2013 | Kikuchi et al. | |
| 2014/0102889 A1 * | 4/2014 | Kajihara | C23C 14/564 204/298.11 |
| 2015/0259788 A1 | 9/2015 | Nagamine et al. | |
| 2015/0279635 A1 | 10/2015 | Subramani et al. | |

\* cited by examiner

METHODS AND APPARATUS FOR PROCESSING A SUBSTRATE

FIELD

Embodiments of the present disclosure generally relate to methods and apparatus for processing a substrate.

BACKGROUND

Various methods for removing or building up material layers for semiconductor devices are known. Physical vapor deposition (PVD) methods are often used in the semiconductor industry.

Dielectric PVD sputtering has many applications in the semiconductor industry, such as, for example, hafnium oxide, tantalum oxide, aluminum oxide for Resistive random-access memory (ReRAM) and conductive-bridging random-access memory (CBRAM) filaments, magnesium oxide for STT-RAM barrier layers, tantalum oxide and titanium oxide for antireflection layers for image sensors, etc. Dielectric materials may be deposited using reactive sputtering, where a metallic conductive target is used and reacts with an oxygen or nitrogen plasma to deposit dielectric, or using a composite non-conductive target with RF power (either capacitive or inductive coupling) to directly sputter the target materials onto the substrate. The second method is typically used for applications in which substrate oxidation or nitridation during the dielectric deposition is not desirable, barring the use of reactive gases in such applications. Although techniques to produce dielectric films using reactive sputtering exist, the inventors have observed that there are still many challenges facing direct dielectric target sputtering using RF plasma, including deposition rate drifting as the process kit life progresses, worsening defect performance, and worsening uniformity.

To address the above-noted issues, an angled multicathode chamber is used. A dielectric target is connected to an RF power supply, and a metallic target is connected to a DC power supply. A rotating shield is used to avoid cross-contamination between the targets during sputtering. The purpose of the metallic target is to paste the shield to recover the deposition rate due to grounding loss caused by dielectric coating. The metallic paste also helps prevent the peeling and flaking of dielectric particles on the shield.

However, the inventors have observed several drawbacks with the above design. Firstly, a large amount of paste is typically needed to serve the above-noted purpose because the dark space area surrounding the target, especially the side wall of the hole in the shield, needs to be sufficiently covered in order to recover the deposition rate. Secondly, contamination of the metallic target is inevitable due to RF sputtering of the dielectric material deposited on the dark spacing area surrounding the target. Typically, some dielectric material is sputtered onto the shield and shutter to allow the paste material to be covered by a thin layer of dielectric to reduce contamination before sputtering the dielectric on the substrate. However, the inventors have observed that the sputtering of some dielectric material onto the paste material will make the chamber particle performance worse. Finally, another drawback of the above apparatus is that the potential of the grounded shield, acts as a negative potential relative to the plasma's positive potential, resulting in the sputtering of materials that have previously been deposited on parts of the shield. Consequently, the inventors have observed that the substrate becomes contaminated due to the pasted metal on the shield being sputtered onto the substrate.

Therefore, the inventors have provided embodiments of an improved method and apparatus for processing a substrate.

SUMMARY

Methods and apparatus for processing a substrate are disclosed herein. In some embodiments, a process chamber includes: a chamber body defining an interior volume; a substrate support to support a substrate within the interior volume; a plurality of cathodes coupled to the chamber body and having a corresponding plurality of targets to be sputtered onto the substrate; and a shield rotatably coupled to an upper portion of the chamber body and having at least one hole to expose at least one of the plurality of targets to be sputtered and at least one pocket disposed in a backside of the shield to accommodate and cover at least another one of the plurality of targets not to be sputtered, wherein the shield is configured to rotate about and linearly move along a central axis of the process chamber.

In some embodiments, a process chamber includes a chamber body defining an interior volume; a chamber body adapter coupled to an upper portion of the chamber body, wherein the chamber body adapter is grounded; a substrate support to support a substrate within the interior volume; a plurality of cathodes coupled the chamber body adapter and having a corresponding plurality of targets to be sputtered onto the substrate; a shield rotatably coupled to the chamber body adapter and having at least one hole to expose at least one of the plurality of targets being sputtered and at least one pocket to accommodate at least another one of the plurality of targets not being sputtered, wherein the shield is configured to rotate about and linearly move along a central axis of the process chamber; and a plurality of grounding rings disposed between the shield and the chamber body adapter to ground the shield, wherein the plurality of targets includes at least one dielectric target and at least one metallic target.

In some embodiments, a method for processing a substrate disposed on a substrate support in a process chamber includes: rotating a shield disposed within the process chamber to expose a dielectric target through a hole in the shield; moving the shield up along a central axis of the process chamber away from the substrate support to a retracted position; depositing dielectric material from the dielectric target onto the substrate; removing the substrate from the process chamber; moving the shield down along the central axis towards the substrate support; rotating the shield to expose a metallic target through the hole in the shield; pasting metallic material from the metallic target onto interior surfaces of the process chamber; and flowing oxygen into the process chamber to oxidize the pasted metallic material.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are thus not to be considered limiting of scope, for the disclosure may admit to other equally effective embodiments.

Figure 1:
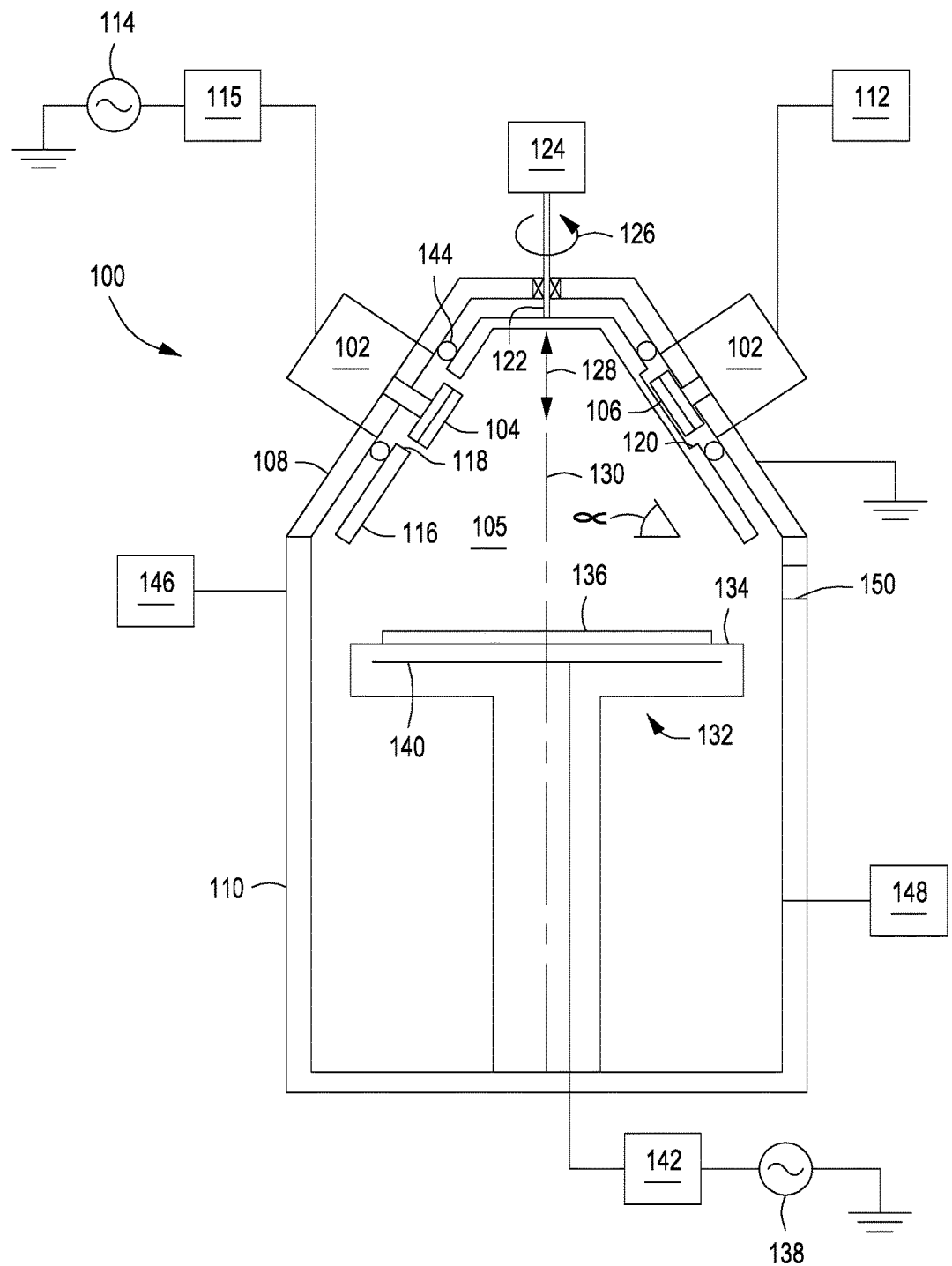
FIG. 1 depicts a schematic view of a multi-cathode processing chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing a substrate are provided herein. The disclosed methods and apparatus may advantageously improve target life, prolong the time period needed before cleaning, and alleviate deposition rate drifting while substantially minimizing or eliminating cross-contamination between targets.

In some embodiments, a multi cathode-PVD chamber (i.e. process chamber 100) includes a plurality of cathodes 102 having a corresponding plurality of targets (at least one dielectric target 104 and at least one metallic target 106), (for example, 5 cathodes) attached to the chamber body (for example, via a chamber body adapter 108). In some embodiments, the metallic target(s) may be formed of metals such as, for example, tantalum, aluminum, titanium, molybdenum, tungsten, and/or magnesium or of a conductive metal oxide such as, for example, titanium oxide, titanium magnesium oxide, and/or tantalum magnesium oxide. However, other metals and/or conductive metal oxides may alternatively be used. The processing chamber includes a substrate support 132 having a support surface 134 to support a substrate 136. The process chamber 100 includes an opening 150 (e.g., a slit valve) through which an end effector (not shown) may extend to place the substrate 136 onto lift pins (not shown) for lowering the substrate onto the support surface 134.

In the embodiment shown in FIG. 1, each target is disposed at a predetermined angle α with respect to the support surface 134. In some embodiments, the angle α may be between about 10° to about 50°. The substrate support includes a biasing source 138 coupled to a bias electrode 140 disposed in the substrate support 132 via a matching network 142. The chamber body adapter 108 is coupled to an upper portion of a chamber body 110 of the process chamber 100 and is grounded. Each cathode can have a DC 112 or RF 114 power source and an associated magnetron. In the case of the RF power source 114, the RF power source 114 is coupled to the cathode via an RF matching network 115.

A shield 116 is rotatably coupled to the chamber body adapter 108 and is shared by all the cathodes. Depending on the number of targets that need to be sputtered at the same time, the rotating shield can have one or more holes to expose a corresponding one or more targets. The shield 116 advantageously limits or eliminates cross-contamination between the plurality of targets 104,106. For example, in some embodiments where five cathodes are provided, the shield 116 may include at least one hole 118 to expose a target 104 to be sputtered and at least one pocket 120 to house a target (e.g., metallic target 106) that is not being sputtered. The shield 116 is rotationally coupled to the chamber body adapter 108 via a shaft 122.

An actuator 124 is coupled to the shaft 122 opposite the shield 116. The actuator 124 is configured to rotate the shield 116, as indicated by arrow 126, and move the shield 116 up and down along the central axis 130 of the process chamber 100, as indicated by arrow 128. The inventors have observed that when the shield 116 is moved up into a retracted position so that a face of the shield surrounding the hole 118 is behind a face of the target (e.g., dielectric target 104) facing the substrate 136, materials sputtered in a dark space surrounding the target (e.g., on a sidewall of the hole 118) are advantageously minimized. As a result, materials sputtered from one target (e.g. dielectric target 104) do not contaminate another target (e.g., metallic target 106) due to sputtering of material that has accumulated in the dark space. In addition, because the amount of dielectric material sputtered onto the dark space is minimized, the amount of metallic material pasted from the metallic target is advantageously reduced by at least three times.

In some embodiments, the shield 116 may be provided with a pocket 120 to house a target not being sputtered. The pocket advantageously prevents scattering of the sputtered target from being deposited on the target not being sputtered. Although such scattering is inevitable, the pocket 120 ensures that the scattering does not contaminate the sputtered surface of the non-sputtered target. As a result, contamination of the target not being sputtered is further reduced.

In some embodiments, the process chamber 100 includes a plurality of grounding rings 144 to provide improved grounding of the shield 116 to the grounded chamber body adapter 108 when the shield is in the retracted position. The RF grounding rings 144 advantageously prevent the shield 116 from getting negatively charged by minimizing the energy between the plasma and the shield. As a result, the chances of the shield being sputtered are further reduced.

In some embodiments, the process chamber 100 further includes a process gas supply 146 to supply a predetermined process gas to an interior volume 105 of the process chamber 100. The process chamber 100 may also include an exhaust pump 148 fluidly coupled to the interior volume 105 to exhaust the process gas from the process chamber 100. In some For example, the process gas supply 146 may supply oxygen to the interior volume 105 after the metallic target 106 has been sputtered. The inventors have observed that flowing oxygen into the process chamber 100 after the metallic paste advantageously reduces the sputter yield of the pasted metallic material because the sputter yield of a metallic oxide (e.g., tantalum oxide) is significantly less than that of the metal (e.g., tantalum). As a result, contamination of the substrate 136 is further reduced.

Figure 2:
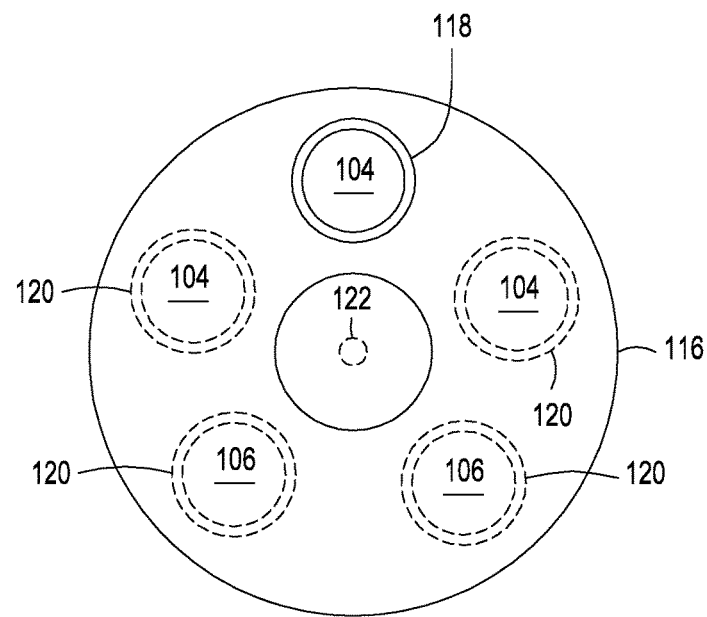
FIG. 2 depicts a bottom view of a shield disposed in the multi-cathode processing chamber of FIG. 1 in accordance with some embodiments of the present disclosure.
Figure 4:
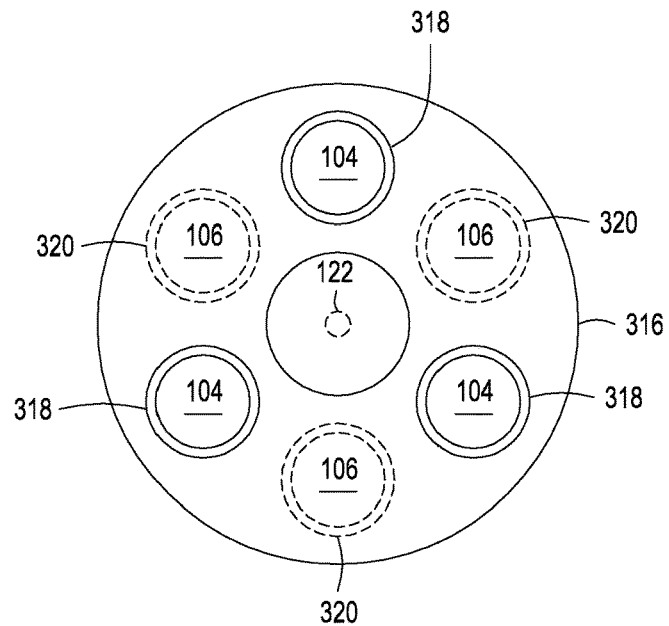
FIG. 4 depicts a bottom view of a shield disposed in the multi-cathode processing chamber of FIG. 3 in accordance with some embodiments of the present disclosure.

FIG. 2 depicts a bottom view of the shield 116 of FIG. 1. Although in FIG. 2, the plurality targets 104, 106 are illustrated as five targets, more or fewer targets may be utilized for example, as shown in FIG. 4 and described below. In the embodiment shown in FIG. 2, the shield 116 may include one hole 118 and four pockets 120. However, the shield 116 may alternatively include more than one hole 118 to expose more than one target to be sputtered.

Figure 3:
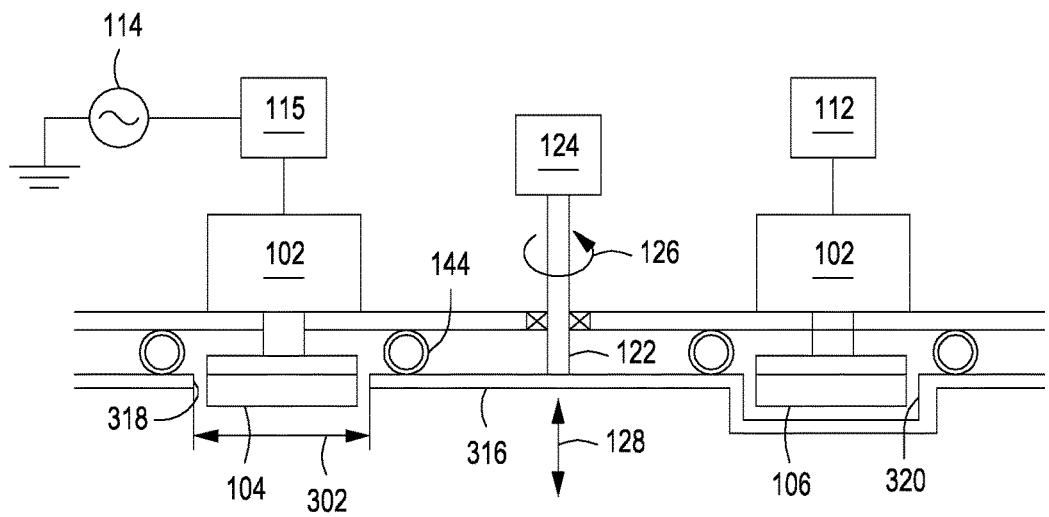
FIG. 3 depicts a schematic view of an upper portion of a multi-cathode processing chamber in accordance with some embodiments of the present disclosure.

FIG. 3 depicts a close-up of an upper portion of a process chamber in accordance with some embodiments of the present disclosure. The elements of the process chamber in FIG. 3 that are the same or similar to corresponding elements of the process chamber 100 of FIG. 1 will be referred to with the same reference characters. As such, a description of these elements will be omitted here. As shown in FIG. 3, a shield 316 having a flat orientation may alternatively be used instead of the angled shield 116 in the process chamber 100 shown in FIG. 1. In the embodiment shown in FIG. 3, the targets 104, 106 are parallel to the support surface 134.

The shield 316 includes one or more holes 318 to expose one or more targets 104, 106 to be sputtered. The shield 316 also includes one or more pockets 320 to house one or more targets that are not being sputtered. The hole 318 differs from the hole 118 of the angled shield 116 in that the hole 318 has a width 302 that is smaller than that of the hole 118. Because the targets 104, 106 are angled with respect to the support surface 134, the hole 118 is large enough to allow the target being sputtered to pass through the hole 118 when the shield 116 is moved to a retracted position. In contrast, because the shield 316 is flat and the targets 104, 106 are parallel to the support surface 134, the width 302 of the hole 318 is only slightly larger than a width of the target. Because the gap between the target being sputtered (e.g., dielectric target 104) and the shield is smaller than that of the angled shield and targets shown in FIG. 1, contamination is further reduced because less material is deposited on the sidewalls of the holes 318.

The inventors have discovered the flat orientation of the shield 316 and the targets 104, 106 shown in FIG. 3 advantageously further improves the RA uniformity from less than 5% using the angled shield 116 of FIG. 1 to about 2-3% with the flat shield 316. In addition, because the shield 316 is flat, more cathodes 102 may be used than with the angled shield 116, assuming the same overall shield diameter.

In some embodiments, for example as depicted in FIG. 4, the plurality of targets may include six targets: three dielectric targets 104 and three metallic targets 106. In the embodiment shown in FIG. 4, the shield 316 includes three non-adjacent holes 318 and three non-adjacent pockets 320. Because the three non-adjacent holes 318 expose three targets to be co-sputtered, the throughput of the process chamber is increased three times over a single sputtered target because the deposition rate is three times that of the single sputter target. In addition, the overall target life is increased since the amount of material sputtered from each target is ⅔ less than a single sputtered target. As a result, the frequency with which the targets are changed is also decreased. Another advantage of the embodiment shown in FIG. 4 is that there is less deposition on the dark space of the shield surrounding each target (i.e., ⅔ less than that of a single sputtered target). As a result, contamination is further reduced and ⅔ less paste material is needed. Although the embodiment of FIG. 4 has been described with reference to the flat shield 316, the configuration shown in FIG. 4 is also applicable to the angled shield 116.

Figure 5:
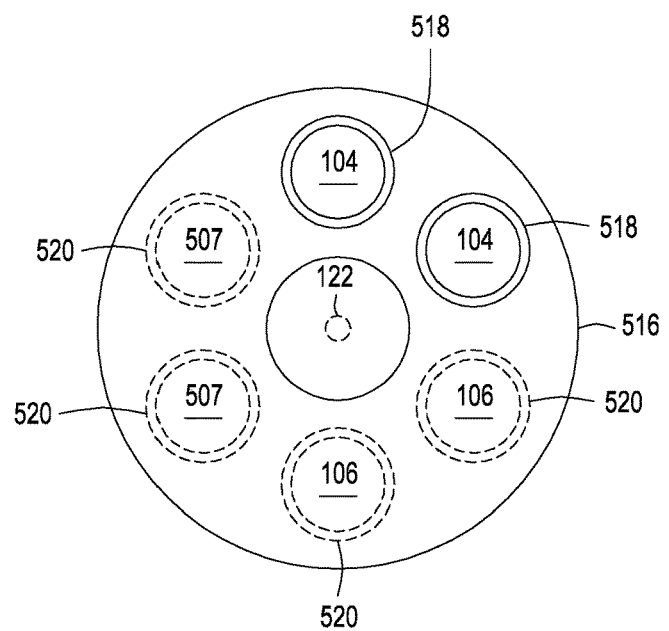
FIG. 5 depicts a bottom view of a shield disposed in the multi-cathode processing chamber of FIG. 3 in accordance with some embodiments of the present disclosure.

FIG. 5 depicts a configuration of a shield 516 in accordance with some embodiments of the present disclosure. The shield 516 is substantially similar to the shield 316 depicted in FIGS. 3 and 4 except that the shield 516 includes two adjacent holes 518 and four pockets 520. In the embodiment shown in FIG. 5, the plurality of targets includes two adjacent dielectric targets 104, two adjacent first metallic targets 106 formed of a first metal, and two adjacent second metallic targets 507 formed of a second metal. In some embodiments, the two adjacent second metallic targets 507 may be a formed of a second dielectric material different than that of the dielectric targets 104. As a result, the shield 516 may advantageously facilitate a stacked deposition process.

In some embodiments, for example, the two adjacent dielectric targets 104 may be formed of magnesium oxide, the two adjacent first metallic targets 106 may be formed of tantalum, and the two adjacent second metallic targets 507 may be formed of magnesium. As a result, either direct sputtering of magnesium oxide from the two adjacent dielectric targets 104 or sputtering of magnesium from the two adjacent second metallic targets 507 and subsequent oxidization may alternatively be performed in the same chamber. The sputtering of the two adjacent second metallic targets 507 and subsequent oxidization may be advantageous over direct sputtering of the dielectric targets 104 because the metal pasting needed after sputtering of the two adjacent second metallic targets 507 is less than that needed for the direct sputtering of the dielectric targets 104.

Figure 6:
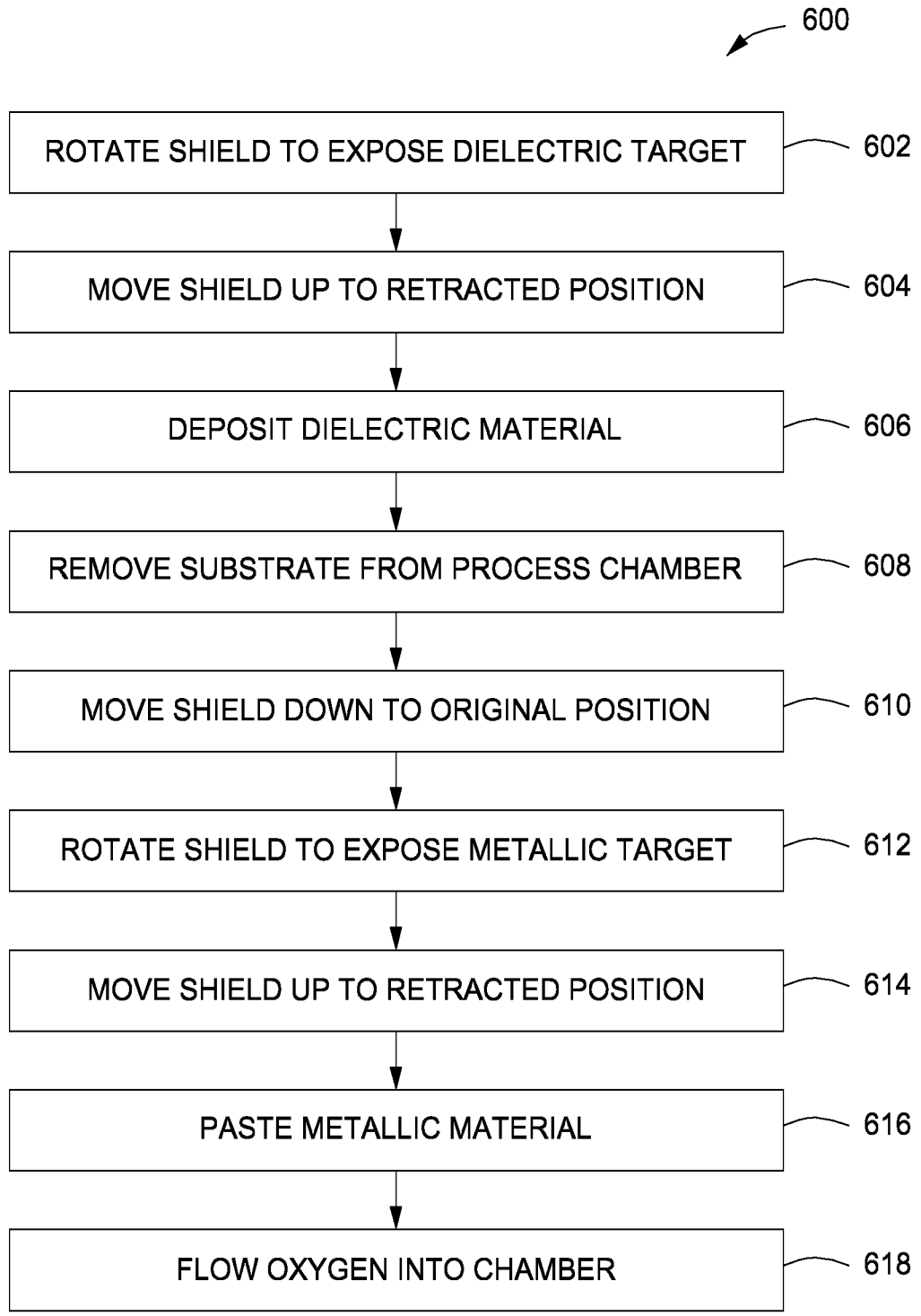
FIG. 6 is a flowchart illustrating a method of processing a substrate in accordance with some embodiments of the present disclosure.

FIG. 6 is a flowchart illustrating a method 600 of processing a substrate 136 in accordance with some embodiments of the present disclosure. At 602, the shield 116, 316 is rotated to expose the dielectric target 104. At 604, the shield is moved up along the central axis 130 of the process chamber 100 to a retracted position so that a face of the shield 116, 316 surrounding the dielectric target 104 is behind a face of the target. At 606, the dielectric material is deposited on the substrate 136. At 608, the substrate 136 is removed from the process chamber 100. At 610, the shield 116, 316 is moved down along the central axis 130 of the process chamber 100 to an original position. At 612, the shield is rotated to expose the metallic target 106. At 614, the shield 116, 316 is moved up along the central axis 130 of the process chamber 100 to a retracted position so that a face of the shield 116, 316 surrounding the metallic target 106 is behind a face of the target. At 616, the metallic target 106 is sputtered to paste the shield 116, 316 and the chamber 100 with the metallic material. At 618, oxygen is flowed from the process gas supply 146 into the interior volume 105 to oxidize the pasted metallic material.

While the foregoing is directed to embodiments of the present disclosure, other and further embodiments of the disclosure may be devised without departing from the basic scope thereof.

The invention claimed is:
1. A process chamber, comprising:
a chamber body defining an interior volume;
a substrate support to support a substrate within the interior volume;
a plurality of cathodes coupled to the chamber body and having a corresponding plurality of targets to be sputtered onto the substrate;
a shield rotatably coupled to an upper portion of the chamber body and having at least one hole to expose at least one of the plurality of targets to be sputtered and at least one pocket disposed in a backside of the shield to accommodate and cover at least another one of the plurality of targets not to be sputtered,
wherein a sputtering surface of at least one of the plurality of targets extends beyond the lowermost surface of the shield when the shield is in a retracted position,
wherein the shield is configured to rotate about and linearly move along a central axis of the process chamber, and
wherein the at least another one of the plurality of targets extends at least partially into the at least one pocket when the shield is in a retracted position;

a chamber body adapter coupled to an upper portion of the chamber body, wherein the chamber body adapter is grounded; and a plurality of grounding rings disposed between the shield and the chamber body adapter to directly ground the shield to the chamber body adapter when the shield is in a retracted position.

2. The process chamber of claim 1, wherein each of the plurality of targets is disposed at a predetermined angle with respect to the substrate support.

3. The process chamber of claim 1, wherein each of the plurality of targets is disposed parallel to the substrate support.

4. The process chamber of claim 3, wherein the plurality of targets includes six targets.

5. The process chamber of claim 4, wherein the six targets include three dielectric targets and three metallic targets.

6. The process chamber of claim 5, wherein the shield includes three non-adjacent holes.

7. The process chamber of claim 4, wherein the six targets include two adjacent dielectric targets, two adjacent first metallic targets formed of a first metal, and two adjacent second metallic targets formed of a second metal.

8. The process chamber of claim 1, wherein the shield is unitary and the pocket forms a recess into the backside of the unitary shield with a top of the recess covering a top surface of a target and sidewalls of the recess covering sides of the target only when the shield is retracted.

9. A process chamber, comprising:
a chamber body defining an interior volume;
a chamber body adapter coupled to an upper portion of the chamber body, wherein the chamber body adapter is grounded;
a substrate support to support a substrate within the interior volume;
a plurality of cathodes coupled the chamber body adapter and having a corresponding plurality of targets to be sputtered onto the substrate;
a shield rotatably coupled to the chamber body adapter and having at least one hole to expose at least one of the plurality of targets being sputtered and at least one pocket to accommodate at least another one of the plurality of targets not being sputtered, wherein the shield is configured to rotate about and linearly move along a central axis of the process chamber; and
a plurality of grounding rings disposed between the shield and the chamber body adapter to directly ground the shield to the chamber body adapter when the shield is in a retracted position,
wherein the plurality of targets includes at least one dielectric target and at least one metallic target.

10. The process chamber of claim 9, wherein each of the plurality of targets is disposed at a predetermined angle with respect to the substrate support.

11. The process chamber of claim 9, wherein each of the plurality of targets is disposed parallel to the substrate support.

12. The process chamber of claim 11, wherein the plurality of targets includes six targets.

13. The process chamber of claim 12, wherein the six targets include three dielectric targets and three metallic targets.

14. The process chamber of claim 13, wherein the shield includes three non-adjacent holes.

15. The process chamber of claim 12, wherein the six targets include two adjacent dielectric targets, two adjacent first metallic targets formed of a first metal, and two adjacent second metallic targets formed of a second metal.

16. The process chamber of claim 15, wherein the shield includes two adjacent holes.

17. The process chamber of claim 9, further comprising:
a process gas supply coupled to the process chamber to supply a predetermined process gas.

18. The process chamber of claim 1, wherein the shield is unitary.

* * * * *